United States Patent
Lee

(10) Patent No.: US 9,209,422 B2
(45) Date of Patent: Dec. 8, 2015

(54) ORGANIC LIGHT EMITTING DISPLAY DEVICE WITH MICRO-CAVITY STRUCTURE

(71) Applicant: LG Display Co., Ltd., Seoul (KR)

(72) Inventor: Se Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/581,822

(22) Filed: Dec. 23, 2014

(65) Prior Publication Data

US 2015/0188087 A1 Jul. 2, 2015

(30) Foreign Application Priority Data

Dec. 31, 2013 (KR) .......................... 10-2013-0169296
Nov. 6, 2014 (KR) .......................... 10-2014-0153928

(51) Int. Cl.
*H01L 51/52* (2006.01)
*H01L 51/50* (2006.01)

(52) U.S. Cl.
CPC .......... *H01L 51/5265* (2013.01); *H01L 51/504* (2013.01); *H01L 51/5056* (2013.01); *H01L 51/5072* (2013.01); *H01L 51/5088* (2013.01); *H01L 51/5271* (2013.01)

(58) Field of Classification Search
CPC .............. H01L 51/5265; H01L 51/504; H01L 51/5271; H01L 51/5088; H01L 51/5056
See application file for complete search history.

(56) References Cited

U.S. PATENT DOCUMENTS 7,830,089 B2 * 11/2010 Murano et al. ................ 313/506
2015/0090984 A1 * 4/2015 Kang et al. ...................... 257/40

* cited by examiner

*Primary Examiner* — William Coleman
(74) *Attorney, Agent, or Firm* — Fenwick & West LLP

(57) ABSTRACT

An organic light emitting display device includes a first electrode defined into red, green and blue sub-pixel regions; a first light emitting unit disposed on the first electrode and configured with a hole injection layer, a first hole transport layer, a first organic emission layer and a first electron transport layer. The device further includes a second light emitting unit disposed on the first light emitting unit and configured with a second hole transport layer, a second organic emission layer and a second electron transport layer; and a second electrode disposed on the second light emitting unit. A separation between the first organic emission layer and the second organic emission layer is larger than a separation between the first electrode and the first organic emission layer.

20 Claims, 6 Drawing Sheets

FIG. 2A

| Item | $X_1$ | $X_2$ | $Y_1$ | $Y_2$ | $Y_3$ | $Y_4$ | Total | Remark |
|---|---|---|---|---|---|---|---|---|
| 1st comparative example | 50 | 700 | 100 | 100 | 50 | 250 | 1250 | Unit: Å |
| 2nd comparative example | 50 | 600 | 100 | 100 | 50 | 350 | 1250 | |
| 3rd comparative example | 50 | 600 | 50 | 50 | 50 | 450 | 1250 | |
| 1st present embodiment | 50 | 400 | 100 | 100 | 50 | 450 | 1150 | |

FIG. 2B

| Item | A | B | Remark |
|---|---|---|---|
| 1st comparative example | 750 | 500 | Unit: Å |
| 2nd comparative example | 650 | 600 | |
| 3rd comparative example | 650 | 600 | |
| 1st present embodiment | 450 | 700 | |

FIG. 3

| Items | IVL measurement data | | | | | Panel simulation |
|---|---|---|---|---|---|---|
| | Color | Volt | cd/A | CIE_x | CIE_y | |
| 1st comparative example | R | 8.9 | 61.3 | 0.684 | 0.313 | 39.8 cd/A<br>Vdd = 13.4V<br>100% on power<br>consumption 14.3W |
| | G | 7.8 | 97.4 | 0.295 | 0.681 | |
| | B | 7.7 | 7.1 | 0.140 | 0.076 | |
| 2nd comparative example | R | 9.3 | 61.9 | 0.681 | 0.315 | 40.1 cd/A<br>Vdd = 13.8V<br>100% on power<br>consumption 14.6W |
| | G | 8.2 | 93.5 | 0.291 | 0.685 | |
| | B | 7.8 | 7.5 | 0.139 | 0.077 | |
| 3rd comparative example | R | 10.1 | 44.1 | 0.687 | 0.309 | 40.4cd/A<br>Vdd=14.6V<br>100% on power<br>consumption 15.0W |
| | G | 8.4 | 99.5 | 0.310 | 0.670 | |
| | B | 7.8 | 8.0 | 0.137 | 0.076 | |
| 1st present embodiment | R | 8.9 | 62.1 | 0.684 | 0.312 | 49.1 cd/A<br>Vdd = 13.4V<br>100% on power<br>consumption 12.3W |
| | G | 7.5 | 100.6 | 0.294 | 0.682 | |
| | B | 7.4 | 10.2 | 0.136 | 0.076 | |

| Items | Thickness A (Å) | Thickness C (Å) | Thickness D (Å) | Thickness E (Å) |
|---|---|---|---|---|
| 4th comparative example | 400 | 300 | 300 | 300 |
| 2nd present embodiment | 350 | 300 | 350 | 300 |
| 3rd present embodiment | 350 | 200 | 450 | 300 |
| 4th present embodiment | 300 | 200 | 500 | 300 |

FIG. 6

Measuring condition:10mA/cm²

| Items | Driving voltage [V] | Current efficiency [cd/A] | Color coordinate [CIE_x] | Color coordinate [CIE_y] | External quantum efficiency [EQE(%)] |
|---|---|---|---|---|---|
| 4th comparative example | 7.2 | 7 | 0.144 | 0.045 | 16.3 |
| 2nd present embodiment | 7.2 | 7.7 | 0.143 | 0.046 | 17.5 |
| 3rd present embodiment | 7.1 | 7.9 | 0.143 | 0.046 | 17.8 |
| 4th present embodiment | 7.1 | 8.0 | 0.143 | 0.045 | 18.0 |

FIG. 7

Measuring condition:10mA/cm²

| Items | Driving voltage [V] | Current efficiency [cd/A] | Color coordinate [CIE_x] | Color coordinate [CIE_y] | External quantum efficiency [EQE(%)] |
|---|---|---|---|---|---|
| 4th comparative example | 6.9 | 177.0 | 0.210 | 0.730 | 52.3 |
| 2nd present embodiment | 6.8 | 174.2 | 0.203 | 0.732 | 52.0 |
| 3rd present embodiment | 6.6 | 183.1 | 0.211 | 0.730 | 53.1 |
| 4th present embodiment | 6.6 | 185.1 | 0.216 | 0.728 | 53.1 |

FIG. 8

Measuring condition:10mA/cm²

| Items | Driving voltage [V] | Current efficiency [cd/A] | Color coordinate [CIE_x] | Color coordinate [CIE_y] | External quantum efficiency [EQE(%)] |
|---|---|---|---|---|---|
| 4th comparative example | 8.4 | 57 | 0.676 | 0.321 | 47.4 |
| 2nd present embodiment | 8.4 | 57 | 0.677 | 0.320 | 48.3 |
| 3rd present embodiment | 8.1 | 56.3 | 0.678 | 0.319 | 48.5 |
| 4th present embodiment | 8.2 | 56.6 | 0.676 | 0.321 | 46.9 |

ORGANIC LIGHT EMITTING DISPLAY DEVICE WITH MICRO-CAVITY STRUCTURE

CROSS-REFERENCE TO RELATED APPLICATIONS

The present application claims priority under 35 U.S.C. §119(a) of Korean Patent Application No. 10-2013-0169296 filed on Dec. 31, 2013 and Korean Patent Application No. 10-2014-0153928 filed on Nov. 6, 2014 which are hereby incorporated by reference in their entirety.

BACKGROUND

1. Field of the Disclosure

The present application relates to an organic light emitting display device. More particularly, the present application relates to an organic light emitting display device of a micro-cavity structure which is adapted to reduce power consumption and enhance light efficiency by adjusting the distance between organic emission layers.

2. Description of the Related Art

Recently, a variety of flat panel display devices with reduced weight and volume are being developed to overcome the deficiencies and disadvantages of cathode ray tube (CRT).

Among the various types of flat panel display devices, an organic light emitting display device is a type of self-luminous device that does not require a separate light source, unlike the LCD device. As such, the organic light emitting display device is easy to manufacture in thinner and lighter weight configurations. Also, the organic light emitting display device can be manufactured through a simplified procedure. Moreover, the organic light emitting display device has other beneficial features such as low driving voltage, high light efficiency, wide viewing angle, and so on. In accordance therewith, the organic light emitting display device is being spotlighted as a next generation display device.

The organic light emitting display device includes organic light emitting diodes corresponding to self-luminous elements. The organic light emitting diode includes an emission layer formed between two electrodes. Such an organic light emitting diode generates excitons by injecting electrons and holes into the emission layer through an electron injection electrode (i.e., a cathode) and a hole injection electrode (i.e., an anode) and recombining the electrodes and the holes within the emission layer. Also, the organic light emitting diode emits light when the excitons are transitioned from an excited state into a ground state.

The organic light emitting display device using the organic light emitting diode can be classified into a top-emission mode device, a bottom-emission mode device, and a dual-emission mode device according to the light emission directions. Also, the organic light emitting display device can be divided into a passive matrix type and an active matrix type.

In order to display an image, the organic light emitting display device can apply scan signals, data signals, and supply voltages to a plurality of sub-pixels, which are arranged in a matrix shape, and enable selected sub-pixels to emit light.

Recent demands for higher definition organic light emitting display devices has resulted in an increase the number of pixels per the unit area of a display panel. As such, each of the pixels has a higher brightness specification.

However, the brightness of the organic light emitting display device depends on the current driven through the organic light emitting diode. When operating the organic light emitting display device in a high current level, the power consumption and the life span of the organic light emitting display device may suffer.

BRIEF SUMMARY

Accordingly, embodiments of the present application are directed to an organic light emitting display device that substantially obviates one or more of problems due to the limitations and disadvantages of the related art.

The embodiments are to provide an organic light emitting display device comprising a micro-cavity structure which is adapted to enhance light efficiency by disposing at least two emission layers in each of red, green, and blue sub-pixels and adjusting the distance between the emission layers.

Also, the embodiments provide an organic light emitting display device comprising a micro-cavity structure which is adapted to enhance white light efficiency of a display panel by disposing at least two emission layers in each of red, green, and blue sub-pixels and adjusting thicknesses of organic material layers disposed above and under the emission layers.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

In order to solve the above-mentioned problems of the related art, an organic light emitting display device according to a general aspect of the present embodiments includes: a first electrode defined into red, green and blue sub-pixel regions; a first light emitting unit disposed on the first electrode comprising with a hole injection layer, a first hole transport layer, a first organic emission layer, a first electron transport layer and a first charge generation layer. The device further includes a second light emitting unit disposed on the first light emitting unit comprising a second charge generation layer, a second hole transport layer, a second organic emission layer and a second electron transport layer; and a second electrode disposed on the second light emitting unit. In one or more embodiments, a total thickness of the layers interposed between the first organic emission layer and the second organic emission layer is greater than a thickness of the layers interposed between the first electrode and the first organic emission layer.

An organic light emitting display device according to another general aspect of the present embodiments includes: a first electrode defined into red, green, and blue sub-pixel regions; a first light emitting unit disposed on the first electrode comprising with a hole injection layer, a first hole transport layer, a first organic emission layer, and a first electron transport layer. The device further includes a second light emitting unit disposed on the first light emitting unit comprising with a second hole transport layer, a second organic emission layer and a second electron transport layer; and a second electrode disposed on the second light emitting unit. In one or more embodiments, a separation (e.g., distance) between the first organic emission layer and the second organic emission layer is larger than separation (e.g., distance) between the first electrode and the first organic emission layer.

In such embodiments, the physical dimensions of the micro cavity structure satisfy the conditions suited for improved emission efficiencies of red light, green light, and blue light emitted from the red, green, and blue sub-pixel regions. As such, the white light efficiency of the display panel is enhanced through the use of these structures.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings:

FIGS. 2A and 2B are tables describing the thicknesses of organic material layers in comparative examples and an embodiment of the present disclosure;

FIG. 3 is a table comparing the light efficiency of sub-pixel regions between the comparative examples and an embodiment of the present disclosure;

FIG. 6 is a table comparing the light efficiency of blue sub-pixel regions between the comparative examples and the embodiments of the present disclosure;

FIG. 7 is a table comparing the light efficiency of green sub-pixel regions between the comparative examples and the embodiments of the present disclosure; and FIG. 8 is a table comparing the light efficiency of red sub-pixel regions between the comparative examples and the embodiments of the present disclosure.

DETAILED DESCRIPTION OF THE EMBODIMENTS

Figure 1:
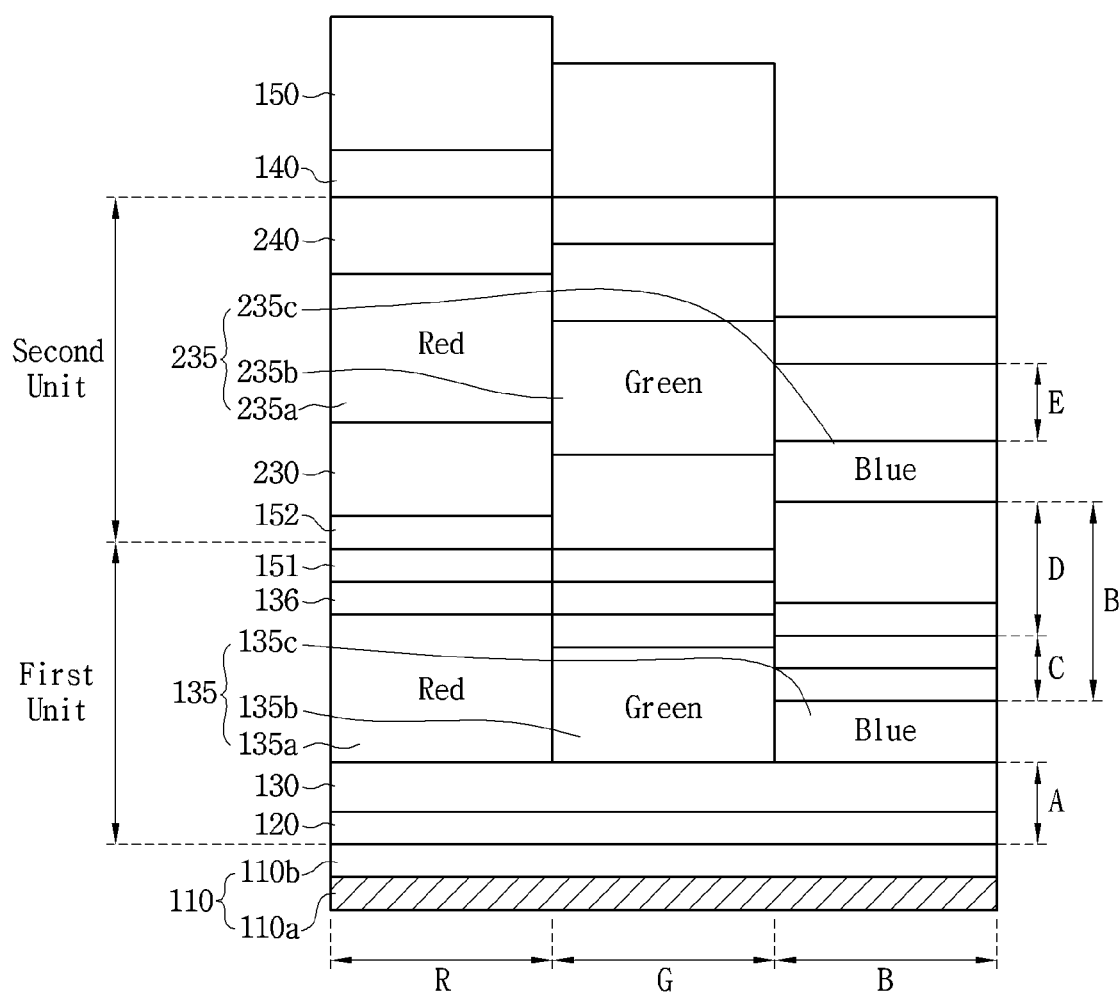
FIG. 1 is a cross-sectional view showing the structure of an organic light emitting display device according to an embodiment of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, various dimensions (e.g., the size and thickness of the device) need not be drawn to scale (e.g., might be enlarged) for the sake of convenience in the drawings. Wherever possible, the same reference numbers will be used throughout this disclosure including the drawings to refer to the same or like parts.

The organic light emitting display device according to the present disclosure includes a timing controller, a data driver, a scan driver and a display panel.

The timing controller receives a vertical synchronous signal, a horizontal synchronous signal, a data enable signal, a clock signal, and a data signal from an external system such as an image processor. Also, the timing controller controls operational timings of the data driver and the scan driver using the timing signals such as the vertical synchronous signal, the horizontal synchronous signal, the data enable signal, the clock signal, and so on.

The data driver samples the data signal applied from the timing controller and latches the sampled data signal, in response to data timing control signals applied from the timing controller. As such, a serial data signal can be converted into a parallel data signal. Also, the data driver converts the parallel digital data signal into analog data signals using gamma reference voltages. The converted analog data signals are applied from the data driver to sub-pixels on the display panel through data lines.

The scan driver sequentially generates scan signals in response to gate timing control signals. Also, the scan driver applies the scan signals to the sub-pixels on the display panel through scan lines.

The display panel includes the sub-pixels arranged in a matrix shape. The sub-pixels can include red, green, and blue sub-pixels. Alternatively, the sub-pixels can include white sub-pixels and a color conversion layer configured to convert white light emitted from the white sub-pixels into red, green, and blue lights. Also, the sub-pixel can be configured in one of a passive type and an active type. For example, the active type sub-pixel includes: a switching transistor configured to transfer a data signal in response to a scan signal; a capacitor configured to store a data voltage corresponding to the data signal; a driving transistor configured to generate a driving current corresponding to the data voltage; and an organic light emitting diode configured to emit light corresponding to the driving current. In this manner, the active type sub-pixel can be configured in a 2T1C (two transistors and one capacitor) structure which includes the switching transistor, the driving transistor, the capacitor, and the organic light emitting diode. Alternatively, the active type sub-pixel can be configured to further include at least one transistor and at least one capacitor as one of a 3T1C structure, a 4T2C structure, a 5T2C structure and so on. Moreover, the sub-pixel can be formed to function in one of a top-emission mode, a bottom-emission mode and a dual-emission mode, according to a light emitting direction.

In order to enhance luminous efficiency and color coordinate, the sub-pixel included in the display panel is formed in one of a micro-cavity structure and a stack structure. The sub-pixel with one of the micro-cavity structure and the stack structure will now be described in detail.

FIG. 1 is a cross-sectional view showing the structure of an organic light emitting display device according to an embodiment of the present disclosure.

Referring to FIG. 1, the organic light emitting display device according to an embodiment of the present disclosure includes a first electrode 110 formed on a substrate, which is defined into red, green and blue sub-pixel regions, and used as a reflective electrode. Also, the organic light emitting display device includes a hole injection layer (HIL) 120 formed on the first electrode 110 in each of the red, green, and blue sub-pixel regions.

The first electrode 110 can be used as an anode electrode of an organic light emitting diode. Also, the first electrode 110 can be formed by stacking a second metal layer 110b of a transparent conductive material on a first metal layer 110a with high reflectance. The first metal layer 110a comprises at least one of aluminum Al and silver Ag. The second metal layer 110b comprises at least one of ITO (indium tin oxide) and IZO (indium zinc oxide).

The hole injection layer 120 can be formed from one selected from a material group which includes phthalocyanine compounds, starburst-type amine-based compounds, arylamine based compounds and p-doped materials. The phthalocyanine compounds can include copper phthalocyanine and so on. The starburst-type amine-based compounds can include TCTA, m-MTDATA and m-MTDAPB. The arylamine based compounds can include NATA, 2T-NATA and NPNPB. The p-doped materials can include F4-TCNQ and PPDN.

Also, the hole injection layer (HIL) 120 can be formed in a first thickness of 'X1'.

A first hole transport layer (HTL) 130 is stacked on the hole injection layer (HIL) 120. The first hole transport layer (HTL) 130 can be formed in a second thickness of 'X2'.

The first hole transport layer (HTL) 130 can be formed from one selected a material group of arylamine-based compounds, starburst-aromatic-amine-based materials, spiro-ladder type materials, NPD (N,N-dinaphthyl-N,N'-diphenyl benzidine), s-TAD and MTDATA (4,4',4''-tris(N-3-methylphenyl-N-phenyl-amino)-triphenylamine), but it is not limited to this. The arylamine-based compounds can include NPB (N,N-naphthyl-N,N'-phenyl benzidine), TPD (N,N'-bis-(3-methylphenyl)-N,N'-bis-(phenyl)-benzidine), PPD, TTBND, FFD, p-dmDPS and TAPC. The starburst-aromatic-amine-based materials can include TCTA, PTDATA, TDAPB, TDBA, 4-a and TCTA. The spiro-ladder type materials can include spiro-TPD, spiro-mTTB and spiro-2.

A first organic emission layer 135 is formed on the first hole transport layer 130 in each of the red, green, and blue sub-pixel regions. An electron blocking layer (not shown) can be formed between the first hole transport layer 130 and the first organic emission layer 135. The first organic emission layer 135 can include a material which emits light having a wavelength within the visible spectrum of light, by receiving and re-combining holes and electrons.

The first organic emission layer 135 can be defined into a first red emission layer 135a, a first green emission layer 135b and a first blue emission layer 135c which are disposed in the red, green, and blue sub-pixel regions, respectively. The first red, green, and blue emission layers 135a, 135b and 135c can be formed to have different thicknesses from one another.

The first red emission layer 135a on the red sub-pixel region can be formed to have a thickness within a range of 600-800 Å. The first green emission layer 135b on the green sub-pixel region can be formed to have a thickness within a range of 300-500 Å. The first blue emission layer 135c on the blue sub-pixel region can be formed to have a thickness within a range of 100-300 Å.

The emission layers can comprise one or more materials with superior fluorescence or phosphorescence quantum efficiency for triplet excitons.

As detailed examples of the emission layers, the first red emission layer 135a can be formed from a host material, which contains one of CBP (carbazole biphenyl) and mCP (1,3-bis(carbazol-9-yl), and a phosphorescent material containing at least one selected from a dopant material group which includes PIQIr(acac) (bis(1-phenylisoquinoline) acetylacetonate iridium), PQIr(acac) (bis(1-phenylquinoline)acetylacetonate iridium), PQIr (tris(1-phenylquinoline) iridium) and PtOEP (octaethylporphyrin platinum). Alternatively, the first red emission layer 135a can include a fluorescent material containing one of PBD:Eu(DBM)3 (Phen) and perylene, instead of the above-mentioned phosphorescent material. However, the first red emission layer 135a is not limited to these.

The first green emission layer 135b can be formed from a host material, which contains one of CBP and mCP, and a phosphorescent material containing a dopant material such as Ir(ppy)3 (fac-tris(2-phenylpyridine)iridium). Alternatively, the first green emission layer 135b can include a fluorescent material containing Alq3 (tris(8-hydroxyquinolinato)aluminum), instead of the above-mentioned phosphorescent material. However, the first green emission layer 135b is not limited to these.

The first blue emission layer 135c can be formed from a host material, which contains one of CBP and mCP, and a phosphorescent material containing a dopant material such as (4,6-F2 ppy)2Irpic. Alternatively, the first blue emission layer 135c can include a fluorescent material containing one selected from a material group which includes spiro-DPVBi, spiro-6P, distyryl benzene (DSB), distyryl arylene (DSA), PFO-based polymer and PPV-based polymer, instead of the above-mentioned phosphorescent material. However, the first blue emission layer 135c is not limited to these.

A first electron transport layer 136 is formed on the first organic emission layer 135. Also, first and second charge generation layers 151 and 152 are stacked on the first electron transport layer 136.

The first electron transport layer 136 can include an electron injection layer. Also, the first electron transport layer 136 can be formed in a third thickness of 'Y1'. The first charge generation layer 151 can be formed in a fourth thickness of 'Y2'. The second charge generation layer 152 can be formed in a fifth thickness of 'Y3'.

The first electron transport layer 136 can be used to easily and smoothly transport the electrons. Also, the first electron transport layer 136 can be formed in at least one of Alq3 (tris(8-hydroxyquinolinato)aluminum), PBD, TAZ, Spiro-PBD, BAlq and SAlq. However, the materials of the first electron transport layer 136 are not limited to the above mentioned materials.

The organic light emitting display device of the present disclosure with the first and second charge generation layers 151 and 152 formed on the first electron transport layer 136 can include at least two emission layers. The emission layers can be used as organic light emitting diodes and each emits light.

The first charge generation layer 151 can include an n-type organic material layer and the second charge generation layer 152 can include a p-type organic material layer. The first charge generation layer 151 corresponding to the n-type charge generation layer is disposed more closer to the first electrode 110 and the second charge generation layer 152 corresponding to the p-type charge generation layer is disposed closer to a second electrode 140 (described in further detail below).

A LUMO (lowest unoccupied molecular orbital) energy level of the first charge generation layer 151 is the same as, substantially the same as, or higher than a HOMO (highest occupied molecular orbital) energy level of the second charge generation layer 152. As such, charges can be effectively generated. The HOMO energy level means a distance from a vacuum level to the highest occupied molecular orbital. The LUMO energy level means another distance from the vacuum level to the lowest unoccupied molecular orbital.

An NP junction structure is formed between the first charge generation layer 151 and the second charge generation layer 152. As such, the charges can be generated. The first and second charge generation layers 151 and 152 can be removed according to circumstances.

Such hole injection layer 120, first hole transport layer 130, first organic emission layer 135, first electron transport layer 136, and first charge generation layer 151 can configure a first light emitting unit 'First Unit' which includes organic light emitting diodes formed in the red, green and blue regions.

Also, second hole transport layer 230, second organic emission layer 235, and second electron transport layer 240 sequentially stacked on the second charge generation layer 152 can configure a second light emitting unit 'Second Unit' which includes organic light emitting diodes formed in the red, green, and blue sub-pixel regions. The second hole transport layer 230 is formed in a sixth thickness of 'Y4' and the second electron transport layer 240 is formed in a seventh thickness of "E".

In this manner, at least two light emitting units can be formed.

The second organic emission layer 235 can be defined into (or include) a second red emission layer 235a, a second green emission layer 235b and a second blue emission layer 235c. The second red, green and blue emission layers 235a, 235b and 235c can have different thicknesses from one another.

The second red, green, and blue emission layers 235a, 235b, and 235c can have the same thicknesses as the respective first red, green and blue emission layers 135a, 135b, and 135c.

Also, the first organic light emission layer 135 and the second organic emission layer 235 may have different thicknesses.

The second electron transport layer 240 can be formed from the same material as the first electron transport layer 136. The second hole transport layer 230 can be formed from the same material as the first hole transport layer 130.

A second electrode 140 is formed on the second electron transport layer 240 of the second light emitting unit. Also, a capping layer (CPL) 150 is formed on the second electrode 140.

The second electrode 140 can be used as a cathode electrode. Also, the second electrode 140 can be formed from a material with low work function, superior conductivity, and low resistance. In detail, the second electrode 140 can be formed from one of an alkali metal corresponding to a first group in the periodic table, an alkali earth metal corresponding to a second group in the periodic table, and a transition metal. For example, the second electrode 140 can be formed from one of silver Ag, aluminum Al, magnesium Mg, lithium Li, calcium Ca, lithium fluoride LiF, indium tin oxide ITO, indium zinc oxide IZO and alloys thereof. However, the materials for forming the second electrode 140 is not limited to these. Also, the second electrode 140 can be formed in a single layer or in a multi-layered structure including any one of the materials mentioned above.

The capping layer 150 can be formed from a material such as NPD (N,N-dinaphthyl-N,N'-diphenyl benzidine).

The organic light emitting display device according to an embodiment of the present disclosure enables the organic material layers in the red, green, and blue sub-pixel regions to have different total thicknesses from one another. Preferably, the total thickness of the organic material layers within the red sub-pixel region is in a thickness range of about 2500-3100 Å, the total thickness of the organic material layers within the green sub-pixel region is in a thickness range of about 2000-2700 Å, and the total thickness of the organic material layers within the blue sub-pixel region is in a thickness range of about 1500-2000 Å.

The hole injection layer 120, the first hole transport layer 130, the first electron transport layer 136, the first and second charge generation layers 151 and 152, the second hole transport layer 230 and the second electron transport layer 240 of the first and the second light emitting units are provided in each of the red, green, and blue sub-pixel regions.

In detail, the total thickness of the first and second organic emission layers 135 and 235 can be different according to the red, green and blue sub-pixel regions. In other words, the total thickness of the first and second red emission layers 135a and 235a, the total thickness of the first and second green emission layers 135b and 235b and the total thickness of the first and second blue emission layers 135c and 235c can be different from one another.

Also, the first red emission layer 135a included in the first organic emission layer 135 of the first light emitting unit can be formed in a different thickness from that of the second red emission layer 235a included in the second organic emission layer 235 of the second light emitting unit. Similarly, the first and second green emission layers 135b and 235b can be formed in different thickness from each other and the first and second blue emission layers 135c and 235c can be formed in different thickness from each other.

As shown in FIG. 1, the organic light emitting display device according to an embodiment of the present disclosure enhances light efficiency by adjusting the thickness A of the organic material layers disposed under the first organic emission layer 135 and the thickness B of the organic material layers interposed between the first and second organic emission layers 135 and 235.

The thickness A of the organic material layers disposed under the first organic emission layer 135 is smaller than the thickness B of the organic material layers interposed between the first and second organic emission layers 135 and 235, as represented by the following equation 1.

$$A<B, (A=X1+X2, B=Y1+Y2+Y3+Y4)$$ Equation 1

In the equation 1, the thickness B of the organic material layers between the first and second organic emission layers 135 and 235 can become 'Y1+Y4' when the first charge generation layer 151 and the second charge generation layer 152 are not formed.

Such a display panel with the above-mentioned micro cavity structure increases the efficiency of white light. This results from the fact that the blue sub-pixel region has higher light emission efficiency than those of the red and green sub-pixel regions.

Figures 4, 5:
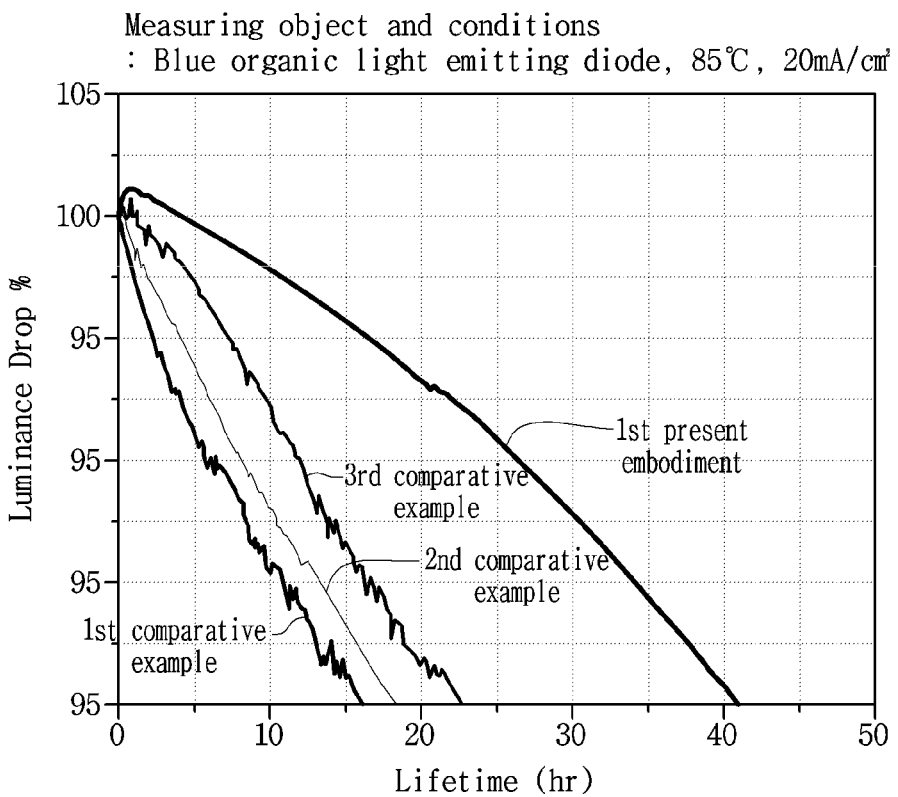
FIG. 4 is a data sheet showing the lifetime difference between the organic light emitting elements between comparative examples an embodiment of the present disclosure.
FIG. 5 is a table describing the thicknesses of organic material layers in comparative examples and the embodiments of the present disclosure.

FIGS. 2A and 2B are comparative tables illustrating thicknesses of organic material layers according to a first present embodiment and first through third comparative examples. FIG. 3 is a table comparison-illustrating light efficiency characteristics of sub-pixel regions according to a first present embodiment and first through third comparative examples. FIG. 4 is a data sheet comparison-illustrating lifetimes of elements of blue sub-pixel regions according to a first present embodiment and first through third comparative examples.

Referring to FIGS. 2A through 4, together with FIG. 1, the organic light emitting display device according to a first embodiment of the present disclosure allows the hole injection layer (HIL) 120 and the first hole transport layer (HTL) 130 disposed under the first organic emission layer 135 to be formed in the first thickness of 'X1 (Å)' and the second thickness of 'X2 (Å)', respectively.

In the organic light emitting display device of the first present embodiment, the first electron transport layer 136 disposed on the first organic emission layer 135 is formed in the third thickness of 'Y1 (Å)'. Also, the first charge generation layer 151 disposed on the first electron transport layer 136 is formed in the fourth thickness of 'Y2 (Å)'. Moreover, the second charge generation layer 152 disposed on the first charge generation layer 151 is formed in the fifth thickness of 'Y3 (Å)'. Furthermore, the second hole transport layer 230 disposed on the second charge generation layer 152 is formed in the sixth thickness of 'Y4 (Å)'.

In a first comparative example, 'X1', 'X2', 'Y1' through 'Y4' are set to be 50 Å, 700 Å, 100 Å, 100 Å, 50 Å and 250 Å, respectively. The thickness A, which is the sum of X1 and X2 is 750 Å. The thickness B, which is the sum of Y1, Y2, Y3 and Y4, is 500 Å. The first comparative example has a condition of 'A>B'. Additionally, the sum of thicknesses A and B is 1250 Å. In the first comparative example, the thickness A (e.g., the thickness of layers between the first electrode 110 and the first organic emission layer 135) is greater than the thickness B (e.g., the thickness of layers between the layers between the first and second organic emission layers 135 and 235).

A second comparative example allows 'X1', 'X2', 'Y1' through 'Y4' to be set to 50 Å, 600 Å, 100 Å, 100 Å, 50 Å and 350 Å, respectively. The thickness A, which is the sum of X1 and X2 is 650 Å. The thickness B, which is the sum of Y1, Y2, Y3 and Y4, is 600 Å. The second comparative example has a condition of 'A>B'. Also, the sum of thicknesses "A" and "B" is 1250 Å. In the second comparative example, the thickness "A" (e.g., the thickness of layers between the first electrode 110 and the first organic emission layer 135) is greater than the thickness "B" (e.g., the thickness of layers between the layers between the first and second organic emission layers 135 and 235). However, the difference between the thickness "A" and the thickness "B" in the second comparative example is smaller than the difference between the thickness "A" and the thickness "B" in the first comparative example.

A third comparative example enables 'X1', 'X2', 'Y1' through 'Y4' to be set to 50 Å, 600 Å, 50 Å, 50 Å, 50 Å and 450 Å, respectively. The thickness A, which is the sum of X1 and X2 is 650 Å. The thickness B, which is the sum of Y1, Y2, Y3 and Y4, is 600 Å. The third comparative example has a condition of 'A>B'. Additionally, the sum of thicknesses A and B is 1250 Å. In the third comparative example, the thickness A (e.g., the thickness of layers between the first electrode 110 and the first organic emission layer 135) is greater than the thickness B (e.g., the thickness of layers between the layers between the first and second organic emission layers 135 and 235). However, the difference between the thickness "A" and the thickness "B" in the third comparative example is smaller than the difference between the thickness "A" and the thickness "B" in the first comparative example.

In the first embodiment of the present disclosure, 'X1', 'X2', 'Y1' through 'Y4' are set to 50 Å, 400 Å, 100 Å, 100 Å, 50 Å and 450 Å, respectively. The thickness A, which is the sum of X1 and X2 is 450 Å. The thickness B, which is the sum of Y1, Y2, Y3 and Y4, is 700 Å. The first embodiment has a condition of 'A<B'. Furthermore, the sum of thicknesses A and B is 1150 Å. Unlike the comparative examples above, in the present embodiment, the thickness A (e.g., the thickness of layers between the first electrode 110 and the first organic emission layer 135) is less than the thickness B (e.g., the thickness of layers between the layers between the first and second organic emission layers 135 and 235).

As seen from FIG. 3, illustrative values (e.g., measured or observed) for driving voltages 'Volt', current efficiencies 'Cd/A' and color coordinates 'CIE_x and CIE_y' of the first present embodiment and the first through third comparative examples for each of red, green, and blue sub-pixel regions are listed.

Referring to the values of parameters for the first embodiment of the present disclosure and the first through third comparative examples, the first embodiment with A=X1+X2 of 450 Å, B=Y1+Y2+Y3+Y4 of 700 Å, which satisfies the condition of A<B, provides a lower power consumption level (12.3 W) and a higher brightness level in comparison to the comparative examples, which do not satisfy the condition A<B.

Even though the supply voltage 'Vdd' was the same in the first embodiment and the first comparative example, the first embodiment of the present disclosure exhibited a superior power consumption level and a panel brightness level than the first comparative example.

In other words, the organic light emitting display device according to an embodiment of the present disclosure, in which the thickness of layers between the first electrode and the first organic emission layer is less than the thickness of layers between the layers between the first and second organic emission layers, provides greater brightness and is more power efficient than organic light emitting display devices where this thickness relationship is reversed.

FIG. 4 illustrates that the lifetime characteristics of organic light emitting diodes of blue sub-pixel regions according to the first present embodiment are greater than those of the first through third examples.

The blue organic light emitting diodes of the first through third comparative examples each have about half of lifetime compared to that of the first present embodiment. This is in part because the blue organic light emitting diodes of the first through third comparative examples are driven at higher temperatures due to high power consumption and so their lifetimes are reduced.

The organic light emitting display device of the present disclosure enables the organic material layers between the first organic emission layer 135 and the second organic emission layer 235 to be formed thinner than the organic material layers between the first electrode 110 and the first organic emission layer 135. As such, a light efficiency is enhanced.

The organic light emitting display device with the micro cavity structure according to the present disclosure disposes at least two organic emission layers in each of the red, green and blue sub-pixel regions and adjusts the distance between the organic emission layers. In accordance therewith, the light efficiency of the organic light emitting display device with the micro cavity structure can be enhanced.

Also, the organic light emitting display device with the micro cavity structure according to the present disclosure disposes at least two organic emission layers in each of the red, green and blue sub-pixel regions and adjusts the thicknesses of the organic material layers which are disposed above and under the organic emission layers. In accordance therewith, the white light efficiency of the organic light emitting display device with the micro cavity structure can be enhanced.

FIG. 5 is a table describing the thicknesses of organic material layers in comparative examples and the embodiments of the present disclosure. FIG. 6 is a table comparing the light efficiency of blue sub-pixel regions between the comparative examples and the embodiments of the present disclosure. FIG. 7 is a table comparing the light efficiency of green sub-pixel regions between the comparative examples and the embodiments of the present disclosure. FIG. 8 is a table comparing the light efficiency of red sub-pixel regions between the comparative examples and the embodiments of the present disclosure.

Referring to FIGS. 5 through 8 together with FIG. 1, the thickness "A" denotes the sum of a thickness of the hole injection layer 120 ("X1") and a thickness of the first hole transport layer 130 ("X2") disposed under the first organic emission layer 135. Also, the total thickness "C" denotes as the sum of a thickness of the first electron transport layer 136 ("Y1") and a thickness of the first charge generation layer 151 ("Y2"). The total thickness "D" denotes the sum of a thickness of the second charge generation layer 152 and a thickness of the second hole transport layer 230. Lastly, the thickness "E" denotes a thickness of the second electron transport layer 240.

$$D \geq A \quad (D=Y3+Y4 \text{ and } A=X1+X2) \quad \text{Equation 2}$$

$$D+E \geq A+C \quad (A=X1+X2, C=Y1+Y2 \text{ and } D=Y3+Y4) \quad \text{Equation 3}$$

$$(D+E)/(A+C) \geq 1 \quad (A=X1+X2, C=Y1+Y2 \text{ and } D=Y3+Y4) \quad \text{Equation 4}$$

In the equations 2 through 4, "A" in the equations above corresponds to the sum of the thickness of the hole injection layer 120 (X1) and the thickness of the first hole transport layer 130 (X2). The first charge generation layer 151 and the second charge generation layer 152 can be selectively removed as needed. As such, the variable "C" and "D" in the equations above may vary depending on the existence of the first and second charge generation layers.

Thus, depending on whether or not the second charge generation layer 152 is present, "D" in the equations above may refer to either the thickness of the second hole transport layer 230 (Y4) or the sum of the thickness of the second hole transport layer 230 (Y4) and the thickness of the second charge generation layer 152 (Y3). Also, depending on whether or not the first charge generation layer 151 is present, "C" in the equations above may refer to either the thickness of the first electron transport layer 136 (Y1) or the sum of the thickness of the first electron transport layer 136 (Y1) and the thickness of the first charge generation layer 151 (Y2).

For example, when the first charge generation layer 151 and the second charge generation layer 152 are removed, "C" in the equations above corresponds to the thickness of the first electron transport layer 136 (Y1) and "D" in the equations above corresponds to the thickness of the second hole transport layer 230 (Y4). In this case, the thickness of the second hole transport layer 230 (D=Y4) can be greater than a total thickness of the hole injection layer 120 and the first hole transport layer 130 (A=X1+X2). Also, a total thickness of the second hole transport layer 230 and the second electron transport layer 240 (D+E or Y4+E) can be greater than a total thickness of the hole injection layer 120, the first hole transport layer 130 and the first electron transport layer 136 (A+C or X1+X2+Y1).

If the conditions of the equations 2 through 4 are satisfied, a constructive interference can occur between the light emitted from the first organic emission layer 135 and the light emitted from the second organic emission layer 235 in the red, green and blue sub-pixel regions. Accordingly, the light efficiency of the organic light emitting display device can be maximized.

In other words, when a micro cavity structure satisfying the conditions of the equations 2 through 4 is implemented in each of the red, green and blue sub-pixel regions, emission efficiencies of red light, green light and blue light emitted from the red, green and blue sub-pixel regions can be maximized. As such, the white light efficiency of the display panel can be enhanced.

Subsequently, detailed embodiments of organic light emitting display devices according to the present disclosure will be described.

Referring to FIGS. 5 through 8, consider the fourth comparative example where the thicknesses A, C, D and E to 400 Å, 300 Å, 300 Å and 300 Å, respectively, and meet a condition that 'A+C>D+E'. Unlike the structure of the present disclosure for enhancing a light efficiency, the conditions in the fourth comparative example is contrary to the conditions of the equations 2 through 4 described above.

The second embodiment of the present disclosure allows the thicknesses A, C, D and E to be set to 350 Å, 300 Å, 350 Å, 300 Å, respectively. As such, the second embodiment of the present disclosure satisfies the conditions of the equations 2 through 4.

The third embodiment of the present disclosure has the thicknesses A, C, D and E set to 350 Å, 200 Å, 450 Å, 300 Å, respectively, which satisfy the conditions of equations 2 through 4.

Also, the fourth embodiment of the present disclosure has the thicknesses A, C, D and E set to 300 Å, 200 Å, 500 Å, 300 Å, respectively, in order to meet the conditions of the equations 2 through 4. In the fourth embodiment, the thickness of "D+E" is larger than the thickness of "D+E" in the third present embodiment.

Referring to the characteristics of the elements of the blue sub-pixel regions shown in FIG. 6, the second through fourth present embodiments gradually enhance the current efficiency (cd/A) and the external quantum efficiency (EQE) compared to the fourth comparative example. Also, the driving voltage and the color coordinates for the second through fourth present embodiments are almost equal to those of the fourth comparative example. As such, the organic light emitting display device with the design structure of the present disclosure provides enhanced efficiency of blue light using substantially the same driving voltage as that of the related art.

Referring to the characteristics of the elements of the green sub-pixel regions as shown in FIG. 7, the third and fourth present embodiments each provides enhanced current efficiency (cd/A) and external quantum efficiency (EQE) compared to the fourth comparative example. Also, the driving voltages in the third and the fourth embodiments of the present disclosure are lower than the driving voltage used in the fourth comparative example. In other words, the structure of the present disclosure provides enhanced efficiency of green light. Referring to the characteristics of the elements of the red sub-pixel regions as shown in FIG. 8, the third embodiment exhibits improved external quantum efficiency (EQE) compared to the fourth comparative example.

The organic light emitting display device with the design structure of the present disclosure obtains high light efficiencies in the blue and green sub-pixel regions even though it cannot provide a high light efficiency to the red sub-pixel region. As such, the white light efficiency of the display panel can be enhanced.

In general, the white light efficiency largely depends on the blue light efficiency. As such, the white light efficiency of the display device can become higher through the enhancement of the blue light efficiency.

As described above, the organic light emitting display device of the present disclosure comprises at least two organic light emitting diodes in each of the red, green and blue sub-pixel regions. A distance between the emission layers of the organic light emitting diodes and another distance between the emission layer of the organic light emitting diode and the electrode is adjusted to meet a specified condition. In accordance therewith, the light efficiency of the organic light emitting display device can be enhanced.

Also, the organic light emitting display device of the present disclosure adjusts thicknesses of the electron transport layer (ETL) and the hole transport layer (HTL) which are included in the organic light emitting diodes stacked in each of the red, green, and blue sub-pixel regions. Therefore, the power consumption of the organic light emitting display device can be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
   a first electrode defined into red, green, and blue sub-pixel regions;
   a first light emitting unit disposed on the first electrode comprising a hole injection layer, a first hole transport layer, a first organic emission layer, a first electron transport layer, and a first charge generation layer;
   a second light emitting unit disposed on the first light emitting unit comprising a second charge generation layer, a second hole transport layer, a second organic emission layer and a second electron transport layer; and
   a second electrode disposed on the second light emitting unit,
   wherein a total thickness of layers interposed between the first organic emission layer and the second organic emission layer is greater than a thickness of layers interposed between the first electrode and the first organic emission layer.

2. The organic light emitting display device of claim 1, wherein the first organic emission layer of the first light emitting unit and the second organic emission layer of the second light emitting unit have different thicknesses.

3. The organic light emitting display device of claim 1, wherein the first and second charge generation layers are formed in an NP junction structure.

4. The organic light emitting display device of claim 1, wherein the layers interposed between the first organic emission layer and the second organic emission layer include the first electron transport layer, the first and second charge generation layers, and the second hole transport layer.

5. The organic light emitting display device of claim 1, wherein the layers interposed between the first electrode and the first organic emission layer include the hole injection layer and the first hole transport layer.

6. The organic light emitting display device of claim 1, wherein the first organic emission layer includes a red emission layer, a green emission layer and a blue emission layer, which are provided in the red, green and blue sub-pixel regions, respectively, and wherein the red emission layer, the green emission layer and the blue emission layer each have a different thickness.

7. The organic light emitting display device of claim 1, wherein the second organic emission layer includes a red emission layer, a green emission layer and a blue emission layer, which are provided in the red, green and blue sub-pixel regions, respectively, and wherein the red emission layer, the green emission layer and the blue emission layer each have a different thickness.

8. The organic light emitting display device of claim 1, wherein the first electrode is formed in a stacked structure which includes a first metal layer with a high reflectance and a second metal layer formed from a transparent conductive material.

9. The organic light emitting display device of claim 1, wherein the second electrode is formed in a single layer structure or a multi-layered structure, and wherein the second electrode includes at least one layer comprising at least one of silver Ag, aluminum Al, magnesium Mg, lithium Li, calcium Ca, lithium fluoride LiF, indium tin oxide (ITO), and indium zinc oxide (IZO).

10. The organic light emitting display device of claim 8, wherein
    the first metal layer comprises at least one of aluminum Al and silver Ag, and
    the second metal layer comprises at least one of indium tin oxide (ITO) and indium zinc oxide (IZO).

11. An organic light emitting display device comprising:
    a first electrode defined into red, green and blue sub-pixel regions;
    a first light emitting unit disposed on the first electrode comprising a hole injection layer, a first hole transport layer, a first organic emission layer and a first electron transport layer;
    a second light emitting unit disposed on the first light emitting unit comprising a second hole transport layer, a second organic emission layer and a second electron transport layer; and
    a second electrode disposed on the second light emitting unit,
    wherein a separation between the first organic emission layer and the second organic emission layer is larger than separation between the first electrode and the first organic emission layer.

12. The organic light emitting display device of claim 11, further comprises a stack of a first charge generation layer and a second charge generation layer interposed between the first electron transport layer of the first light emitting unit and the second hole transport layer of the second light emitting unit.

13. The organic light emitting display device of claim 11, wherein a thickness of the second hole transport layer is greater than a total thickness of the hole injection layer and the first hole transport layer.

14. The organic light emitting display device of claim 11, wherein a total thickness of the second hole transport layer and the second electron transport layer is greater than a total thickness of the hole injection layer, the first hole transport layer and the first electron transport layer.

15. The organic light emitting display device of claim 11, wherein the first organic emission layer includes a red emission layer, a green emission layer and a blue emission layer, which are provided in the red, green and blue sub-pixel regions, respectively, and wherein the red emission layer, the green emission layer and the blue emission layer each has a different thickness.

16. The organic light emitting display device of claim 11, wherein the second organic emission layer includes a red emission layer, a green emission layer and a blue emission layer, which are provided in the red, green and blue sub-pixel regions, respectively, and wherein the red emission layer, the green emission layer and the blue emission layer each has a different thickness.

17. The organic light emitting display device of claim 11, wherein the first electrode is formed in a stacked structure which includes a first metal layer with a high reflectance and a second metal layer formed from a transparent conductive material.

18. The organic light emitting display device of claim 11, wherein the second electrode is formed in a single layer structure or a multi-layered structure, and wherein the second electrode includes at least one layer comprising at least one of silver Ag, aluminum Al, magnesium Mg, lithium Li, calcium Ca, lithium fluoride LiF, indium tin oxide (ITO), and indium zinc oxide (IZO).

19. The organic light emitting display device of claim 12, wherein the first and second charge generation layers are configured in an NP junction structure.

20. The organic light emitting display device of claim 17, wherein
the first metal layer comprises at least one of aluminum Al and silver Ag, and
the second metal layer comprises at least one of indium tin oxide (ITO) and indium zinc oxide (IZO).

* * * * *